(12) United States Patent  
Fujima

(10) Patent No.: US 7,203,125 B2  
(45) Date of Patent: Apr. 10, 2007

(54) WORD LINE DRIVING CIRCUIT WITH A WORD LINE DETECTION CIRCUIT

(75) Inventor: Shiro Fujima, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 127 days.

(21) Appl. No.: 11/148,413

(22) Filed: Jun. 9, 2005

(65) Prior Publication Data

US 2005/0276148 A1    Dec. 15, 2005

(30) Foreign Application Priority Data

Jun. 11, 2004    (JP)    ............................. 2004-174141

(51) Int. Cl.
    *G11C 8/08*    (2006.01)
(52) U.S. Cl. ............ 365/230.06; 365/204; 365/185.23; 365/185.25
(58) Field of Classification Search ........... 365/230.06, 365/189.09, 189.11, 185.23, 204, 149, 189.07, 365/185.25
    See application file for complete search history.

(56) References Cited

U.S. PATENT DOCUMENTS

| | | | | |
|---|---|---|---|---|
| 5,416,747 A | * | 5/1995 | Ohira | ..................... 365/230.06 |
| 5,557,580 A | * | 9/1996 | Numaga et al. | ........ 365/230.06 |
| 5,650,976 A | * | 7/1997 | McLaury | ................ 365/230.06 |
| 6,046,956 A | | 4/2000 | Yabe | |
| 6,111,808 A | * | 8/2000 | Khang et al. | ........... 365/230.06 |
| 6,337,831 B1 | * | 1/2002 | Nam | ...................... 365/230.06 |
| 6,628,564 B1 | * | 9/2003 | Takita et al. | ............ 365/230.06 |
| 6,646,949 B1 | * | 11/2003 | Ellis et al. | .............. 365/230.06 |

FOREIGN PATENT DOCUMENTS

JP    10-241361    9/1998

* cited by examiner

*Primary Examiner*—J. H. Hur
(74) *Attorney, Agent, or Firm*—Foley & Lardner LLP

(57) ABSTRACT

A semiconductor storage device having a word line driving circuit of a small circuit scale, and operating in stability. The device includes a first driving circuit 11 for driving a word line driving signal 15 towards a first potential, a second driving circuit 12 for driving the word line driving signal 15 towards a second potential, a third driving circuit 13 for driving the word line driving signal 15 to a third potential, and a driving control circuit 14. This driving control circuit 14 actuates the first driving circuit 11 when the input signal 16 is at a first logical value, while actuating the second driving circuit 12 when the input signal 16 transfers from the first logical value to the second logical value and actuating the third driving circuit 13 on detection that the word line driving signal 15 has been driven towards the second potential.

18 Claims, 6 Drawing Sheets

WORD LINE DRIVING CIRCUIT WITH A WORD LINE DETECTION CIRCUIT

FIELD OF THE INVENTION

This invention relates to a semiconductor storage device and, more particularly, to a semiconductor storage device including a driving circuit for a word line used for accessing a memory cell.

BACKGROUND OF THE INVENTION

A semiconductor storage device, including memory cells at the points of intersection of word lines and bit lines, arranged at right angles thereto, is finding widespread use in many fields of applications. With this semiconductor storage device, a negative word line system, in which the 'floating' of the VBB level of the negative potential at the time of resetting the word line is suppressed to diminish the leakage current of, e.g., the memory cell, has been known and disclosed in, e.g., Patent Publication 1. In the word line driving circuit of the Patent Document 1, the voltage on the word line is pulled down to the potential VSS (ground potential), after which the word line voltage is lowered to VBB (negative potential) that is lower than VSS over a certain time delay. This preset time delay is generated by a delay circuit in a signal generating circuit adapted for generating a word line driving signal.

It is also possible to suppress the consumption of the VPP potential, at the time of activation of the word line, in the same manner as the case where the 'float' of the VBB level is suppressed at the time of resetting the word line. It is known that the VPP, as the boost-up power supply, is generated within the DRAM, by exploiting a charge pumping system from the power supply VDD. Hence, the following equation:

$$IVPP=\alpha*IVDD$$

where IVPP is the current consumption of VPP, IVDD is the current consumption of VDD and α is a constant, may be obtained. From the equation, reduction of IVPP has a marked effect in decreasing the current consumption IVDD of the DRAM itself.

[Patent Document 1]
JP Patent Kokai Publication No. JP-A-10-241361 (FIGS. 3, 5 and 8)

SUMMARY OF THE DISCLOSURE

The timing of pulling down the word line voltage to the VBB level from the GND (ground potential level), to which the word line voltage has previously been pulled down, is crucial in suppressing the 'float' of the VBB level. The timing control is by a signal generated from a signal generating circuit (timing generator), employing a delay element (delay circuit), as described above. A plural number of the signal generating circuits are sporadically distributed within the DRAM chip, such that, a control signal generated by the timing generator provided at a specified location cannot cope with the skew distortion which depends on the layout-based location of the circuit. Consequently, for managing timing control within the signal generating circuit, it is necessary to provide a delay device for each circuit, thus necessarily increasing the block size.

In a test mode, frequently used in a DRAM test, it may be an occurrence that the word line is activated during the time duration several to tens of times longer than in a normal operation. In such case, the word line decay time (fall time) becomes longer than usual, so that the switching of the pull-down timing from GND to VBB needs to be carried out by a control operation consistent with the time duration of activation. The result is that plural delay elements need to be provided in the timing generator and switched depending on the operating mode, thus complicating the circuitry.

Moreover, should there be level variations in the power supply VDD, the delay time in the delay elements is varied, so that the voltage pull-down start timing cannot be controlled in stability.

Therefore there is much desired in the art for a semiconductor storage device which is small in circuit size and which is provided with a word line driving circuit operating in stability.

In one aspect, the present invention provides a semiconductor storage device comprising a word line driving circuit adapted for driving a word line by a driving potential changed in stages upon rise or fall. The word line driving circuit comprises a detection circuit for detecting the signal level of the word line to output the result of detection, with the driving timing of the word line being controlled based on an output of the detection circuit.

Preferably, the word line driving circuit drives the word line from a first potential towards a second potential, whereupon the detection circuit detects that the word line has been driven towards the second potential, so that the word line is driven towards a third potential based on an output of the detection circuit.

In another aspect, the present invention provides a semiconductor storage device comprising: a first driving circuit for driving a word line towards a first potential, a second driving circuit for driving the word line towards a second potential, a third driving circuit for driving the word line towards a third potential, and a driving control circuit for actuating the first driving circuit when an input signal is at a first logical value, for actuating the second driving circuit when the input signal transfers from the first logical value to the second logical value and for actuating the third driving circuit on detection that the word line has been driven towards the second potential.

The second potential may be somewhere between the first and third potentials.

The first potential may be higher than a power supply voltage of the driving control circuit, the second potential may be the ground potential of the driving control circuit and the third potential may be lower than the ground potential.

The first potential may be lower than the ground potential of the driving control circuit, the second potential may be the potential of the power supply voltage of the driving control circuit and the third potential may be higher than the power supply voltage.

The driving control circuit may include a logical circuit for detecting that the word line has been driven towards the second potential. The logical circuit may be driven by a power supply voltage of the driving control circuit.

The first and third driving circuits may include a circuit for converting the signal level of the input signal.

In another aspect, the present invention provides a semiconductor storage device comprising: a first driving circuit for driving a word line towards a first potential, a second driving circuit for driving the word line towards a second potential, a third driving circuit for driving the word line towards a third potential, a fourth driving circuit for driving the word line towards a fourth potential, and a driving control circuit. The driving control circuit is featured for actuating the first driving circuit when an input signal is at a first logical value, for actuating the second driving circuit when the input signal transfers from the first logical value to the second logical value, for actuating the third driving circuit on detection that the word line has been driven towards the second potential, for actuating the fourth driving circuit when the input signal transfers from the second logical value towards the first logical value, and for actuating the first driving circuit on detection that the word line has been driven towards the fourth potential.

The first potential may be lower than the ground potential of the driving control circuit, the second potential may be the potential of the power supply voltage of the driving control circuit, the third potential may be higher than the power supply voltage and the fourth potential may be the ground potential of the driving control circuit.

The driving control circuit may include a first logical circuit for detecting that the word line has been driven towards the second potential and a second logical circuit for detecting that the word line has been driven towards the fourth potential, with the first and second logical circuits operating at a power supply voltage of the driving control circuit.

The semiconductor storage device may be a DRAM.

The meritorious effects of the present invention are summarized as follows.

According to the present invention, control is exercised so that, during the rise or fall of the word line driving signal, the signal level of the word line driving signal is fed back in the driving control circuit, and the changes in the signal level of the word line driving signal per se are detected to effect a two-stage operation. Hence, there is no necessity of providing external control circuits or external delay elements for achieving the two-stage operation, thus simplifying the circuit configuration. No timing adjustment is needed for carrying out the two-stage operation, thus assuring stable operations.

PREFERRED EMBODIMENTS OF THE INVENTION

Figure 1:
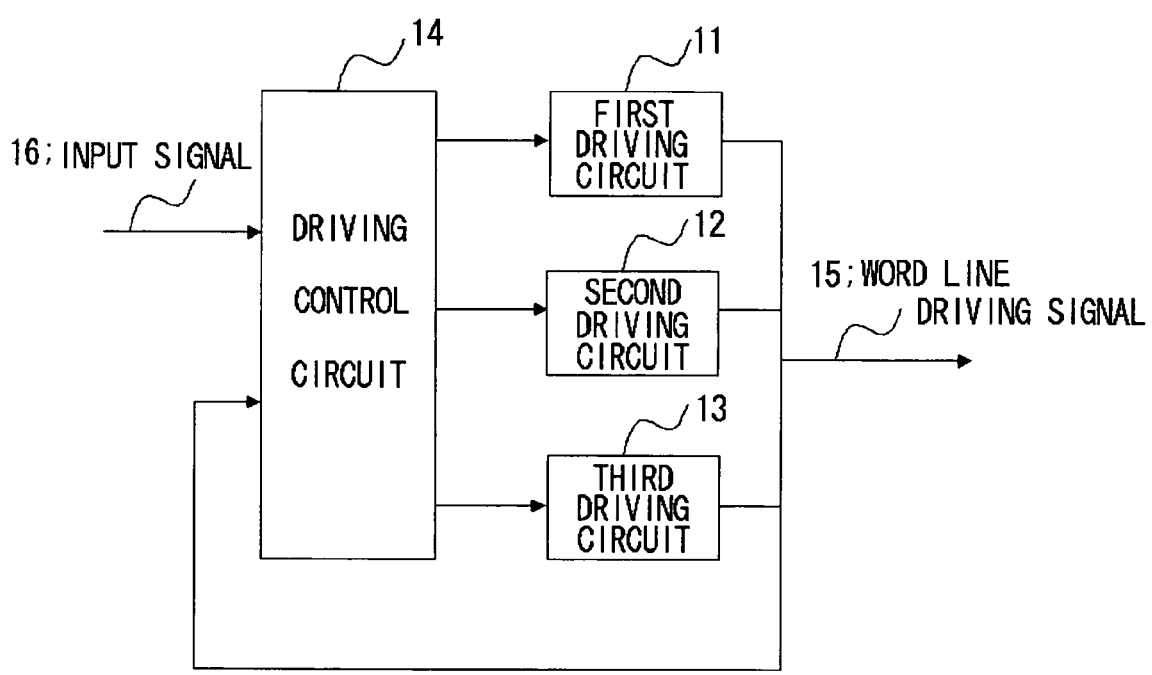
FIG. 1 is a block diagram showing a word line driving circuit embodying the present invention.

FIG. 1 depicts a block diagram of a word line driving circuit of a semiconductor storage device embodying the present invention. The device includes a first driving circuit 11 for driving a word line driving signal 15 towards a first potential, a second driving circuit 12 for driving the word line driving signal 15 towards a second potential, a third driving circuit 13 for driving the word line driving signal 15 towards a third potential, and a driving control circuit 14. This driving control circuit 14 actuates the first driving circuit 11 when the input signal 16 is at a first logical value, whereas actuating the second driving circuit 12 when the input signal 16 transfers from the first logical value to the second logical value, and actuating the third driving circuit 13 on detection that the word line driving signal 15 has been driven towards the second potential.

With the word line driving circuit, described above, the potential is changed in a two-step operation with the second and third potentials, during the rise or fall of the word line driving signal 15. This two-stage voltage pull-down operation is carried out by feeding the signal level on the word line driving signal 15 back to the driving control circuit 14, so that there is no necessity of providing a control circuit or a delay circuit for effecting two-stage operations. In addition, no timing adjustment for effecting the two-stage operation is needed.

First Embodiment

Figure 2:
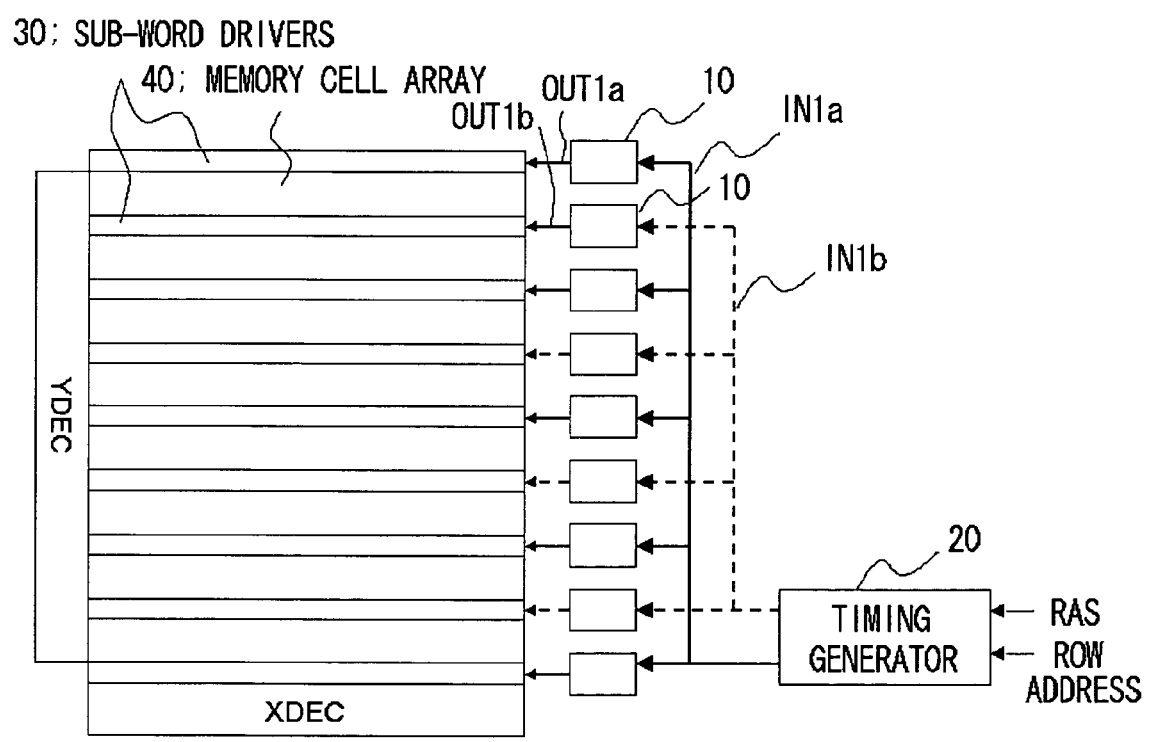
FIG. 2 is a circuit diagram showing essential portions of the semiconductor storage circuit of a first embodiment of the present invention.

Next, typical circuits, embodying the present invention, are explained in detail. FIG. 2 depicts a block circuit diagram showing a word line driving circuit of a DRAM as a main component of the present invention. The chip of the DRAM in its entirety is split in eight parts for forming plural memory blocks or banks. These blocks, resulting from division into eight parts, include a memory cell array 40 of a similar structure, respectively. On both sides of each memory cell array 40 are arranged sub-word drivers 30. A Y decoder YDEC is provided for extending along one side (end) of the memory cell arrays 40, and an X decoder XDEC is arranged for extending at right angles to the Y decoder. A plurality of sub-word lines, not shown, extend vertically from the X decoder XDEC, whilst a plurality of Y-selecting lines, not shown, extend from the Y decoder YDEC. A memory cell is selected by one of the sub-word lines and one of the Y selecting lines for access.

In FIG. 2, a timing generator 20 is supplied with a row address strobe (RAS) signal and with a row address signal in the DRAM, and outputs a signal IN1$a$ (IN1$b$) to an associated word line driving circuit 10 for accessing a predetermined memory cell array 40. The word line driving circuit 10 drives the sub-word driver 30, based on a signal entered from the timing generator 20. Each of the sub-word drivers 30 is connected to a respective one of the memory cell arrays 40 to drive the memory cells in the memory cell array 40 in accordance with an output signal OUT 1$a$ (OUT 1$b$) of the word line driving circuit 10.

In the above configuration, the word line driving circuit 10 performs control so that, in the rise/fall of the word line, the output signals (OUT1$a$, OUT1$b$) be changed in potential in two stages. The word line driving circuit 10 will now be explained in detail.

Figure 3:
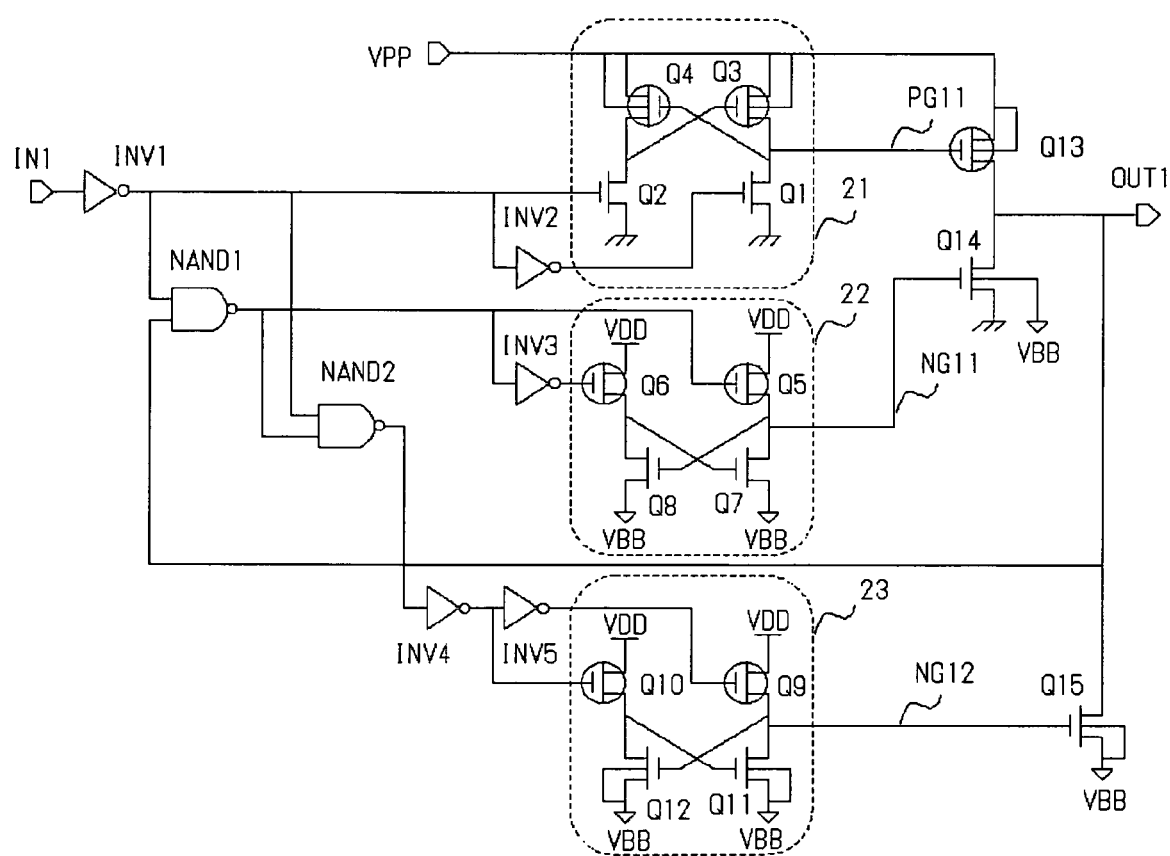
FIG. 3 is a circuit diagram showing the word line driving circuit according to the first embodiment of the present invention.

FIG. 3 depicts a circuit diagram showing a word line driving circuit according to the first embodiment of the present invention. In FIG. 3, the driving circuit includes n-channel FETs Q1, Q2, Q7, Q8, Q11, Q12, Q14 and Q15, p-channel FETs Q3, Q4, Q5, Q6, Q9, Q10 and Q13, inverter circuits INV1, INV2, INV3, INV4 and INV5, and NAND circuits NAND1, NAND2.

An input signal IN1 of the driving circuit is entered to the inverter circuit INV1. An output signal of the inverter circuit INV1 is supplied to the gate of the FET Q2, an input terminal of the inverter circuit INV2, one input terminal of the NAND circuit NAND1 and to one input terminal of the NAND circuit NAND2. An output terminal of the inverter circuit INV2 is connected to the gate of the FET Q1.

An output signal OUT1 of the driving circuit is supplied to the other input terminal of the NAND circuit NAND1. An output terminal of the NAND circuit NAND1 is connected to the gate of the FET Q5, an input terminal of the inverter INV3 and to the other input terminal of the NAND circuit NAND2. An output terminal of the NAND circuit NAND2 is connected to an input terminal of the inverter INV4, an output terminal of which is connected to the gate of the FET Q10 and to an input terminal of the inverter INV5. An output terminal of the inverter circuit INV5 is connected to the gate of the FET Q9.

The FET Q1 to and the FET Q4 make up a level converter circuit 21. The sources of the FET Q1 and FET Q2 are grounded. The drain of the FET Q1, the drain of the FET Q3 and the gate of the FET Q4 are connected to one another in common and further to the gate of the FET Q13. The drain of the FET Q2, the drain of the FET Q4 and the gate of the FET Q3 are connected to one another in common, while the sources of the FET Q4 and the FET Q3 are connected to a power supply VPP.

The FETs Q5 to FET Q8 make up a level converter circuit 22. The sources of the FET Q7 and FET Q8 are connected to a power supply VBB. The drain of the FET Q7, the drain of the FET Q5 and the gate of the FET Q8 are connected to one another in common and further to the gate of the FET Q14. The drain of the FET Q8, the drain of the FET Q6 and the gate of the FET Q7 are connected to one another in common, while the sources of the FET Q5 and the FET Q6 are connected to a power supply VDD.

The FETs Q9 to FET Q12 make up a level converter circuit 23. The sources of the FET Q11 and FET Q12 are connected to a power supply VBB. The drain of the FET Q11, the drain of the FET Q9 and the gate of the FET Q12 are connected to one another in common and further to the gate of the FET Q15. The drain of the FET Q12, the drain of the FET Q10 and the gate of the FET Q11 are connected to one another in common, while the sources of the FET Q9 and the FET Q10 are connected to the power supply VDD.

The source of the FET Q13 is connected to the power supply VPP. The drain of the FET Q13 is connected to the drains of the FET Q14 and Q15 to operate as an output terminal OUT1. The source of the FET Q14 is grounded, while the source of the FET Q15 is connected to the power supply VBB.

The above-described driving circuit controls, by the input signal IN1, the output signal OUT1, operating as a power supply source for a word line. While the input signal IN1 is of an amplitude between the ground (GND) and VDD, the output signal OUT1 is of an amplitude between VBB (negative potential)/VPP (word boost potential). The level converter circuits 21 to 23 and the FETs Q13 to FET Q15, connected to outputs thereof, are provided for this amplitude conversion. The level converter circuit 21 converts the amplitude level for VDD/VPP, while the level converter circuits 22, 23 take charge of level conversion for GND/VBB. On the other hand, the output signal OUT1 is fed back to the NAND circuit NAND1 so that the output of the NAND circuit NAND1 will be inverted with the level state (VPP or VBB) of the output signal OUT1.

Figure 4:
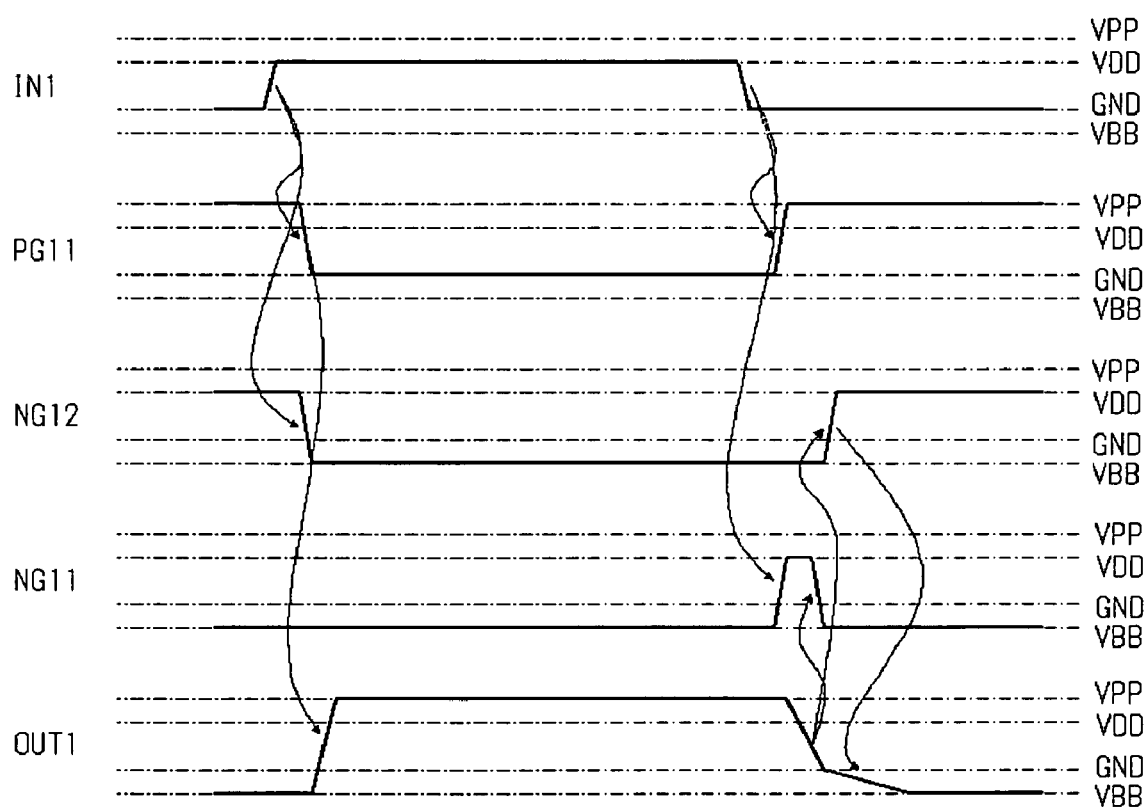
FIG. 4 is a timing chart for the word line driving circuit according to the first embodiment of the present invention.

The operation of the driving circuit, shown in FIG. 3, will now be explained. FIG. 4 depicts a timing chart of a word line driving circuit of a semiconductor storage device according to a first embodiment of the present invention. In a DRAM employing a negative word line system, the input signal IN1 is fixed in a pre-charge state at the GND level, while the output terminal OUT1 is fixed at the VBB level (negative potential). If, from this state, the DRAM is activated, such as upon receipt of an activating command, the input signal IN1, generated from e.g. a timing generator in the chip, transfers to a VDD level. While the input signal IN1 undergoes level transition between GND/VDD, the output signal OUT1 undergoes level transition between VBB/VPP, by level conversion caused by the level converter circuits 21 to 23. Responsive to transition from GND to VDD of the input signal IN1, the potentials of signals PG11, NG11 and NG12 of the gates of the FETs Q13 to Q15, connected to the output terminal OUT1, undergo changes as shown in FIG. 3, respectively, such that the output signal OUT1 is changed from the VBB level to the VPP level. The input signal IN1 includes the address information from outside the DRAM, and selectively boosts the word line within the DRAM.

If the DRAM then receives a pre-charge command, from its active state, the word line, for example, is restored to a reset state. At this time, the output signal OUT1, boosted to the VPP level, is transiently pulled down to close to the GND level, via FET Q14. When the level of the output signal OUT1 becomes lower than the threshold potential of the NAND circuit NAND1, the FET Q14 is turned off. Substantially simultaneously, the FET Q15 is turned on and ultimately the output signal OUT1 is pulled down to the VBB level. That is, the electrical charges, accumulated to the VPP level, are not discharged at a time to the VBB level, but are discharged to GND for the time being and the signal OUT1, at this GND level, is further lowered to the VBB level. This suppresses the 'float' of the VBB level at the time of resetting the word line.

With the driving circuit of the above configuration, one output signal line (word line) may be driven based on a sole input signal line. In general, when a number of driving circuits are distributed in a DRAM chip, there is a fear that layout-related skew deviation of the switching timing of two-stage voltage pull-down may occur at the time of the resetting. However, with the driving circuit of the present embodiment, it is unnecessary to perform skew timing adjustment, because the driving circuit itself controls the switching timing. In addition, in the test mode, frequently used in the DRAM, the word line selecting operation amounts to several to tens of times of that of the usual case. Even for this test mode, the switching of the two-stage voltage pull-down operation may be reliably carried out without the necessity of performing timing adjustment suited to the respective operations. Moreover, since the switching timing is controlled without employing a delay circuit, timing offset due to variations in the VDD is scarcely produced. In addition, since the switching timing of switching to VBB or VPP is controlled based on the timing of decay to GND or of rise to VDD, the switching timing is not varied even with voltage changes to VBB or VPP.

Second Embodiment

Figure 5:
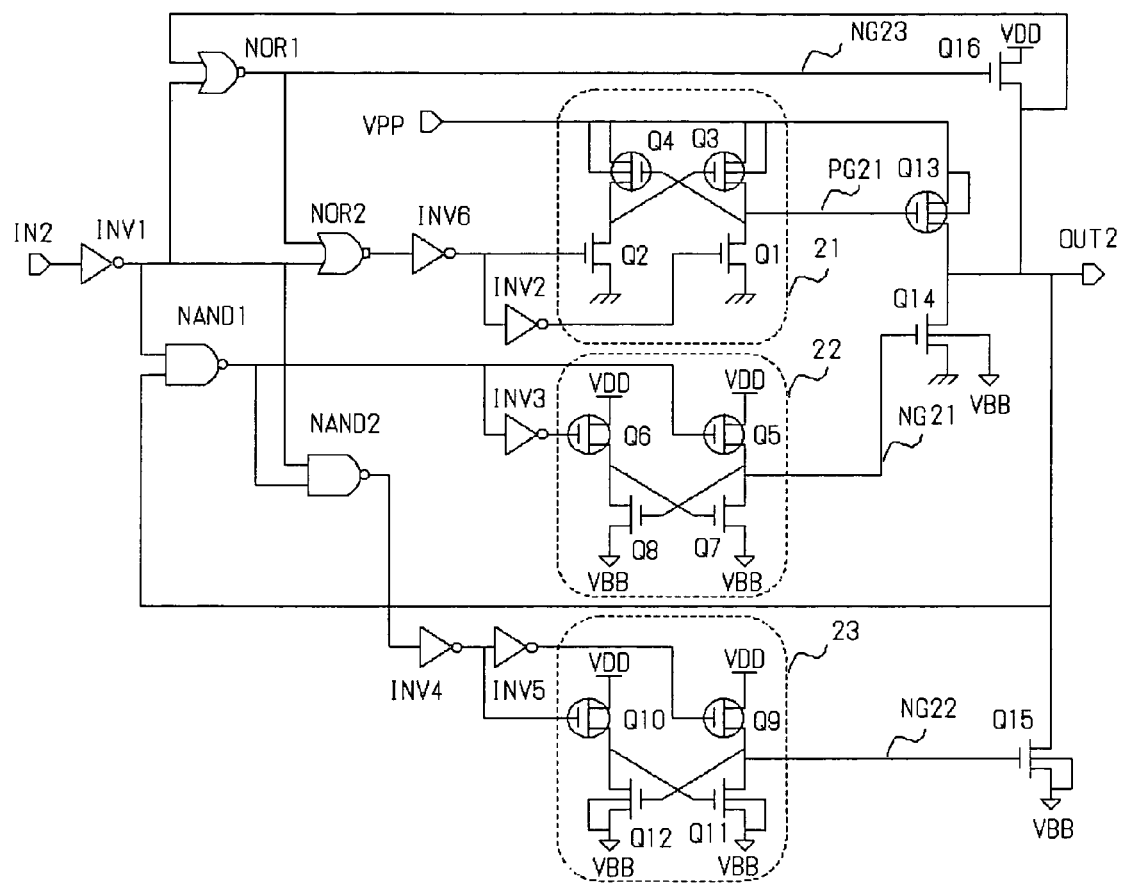
FIG. 5 is a circuit diagram showing a word line driving circuit according to a second embodiment of the present invention.

FIG. 5 depicts a circuit diagram showing a driving circuit of a word line of a semiconductor storage device according to a second embodiment of the present invention. The driving circuit of the second embodiment corresponds to the driving circuit of the first embodiment to which is included a circuit for enabling two-stage operation, even on startup. In FIG. 5, the same reference numerals as those of FIG. 3 denote the same or equivalent parts and the corresponding explanation is omitted. In FIG. 5, an FET Q16, a NOR circuit NOR1, a NOR circuit NOR2 and an inverter circuit INV6 are added to FIG. 3.

The source of the FET Q16 is connected to VDD, and the drain thereof is connected to the drain of the FET Q13, the drain of the FET Q14 and to the drain of the FET Q15 to generate an output signal OUT2 of the driving circuit. In addition, the drain of the FET 16 is connected to one input terminal of the NOR circuit NOR1. The drain of the FET Q16 is connected to an input terminal of the NOR circuit NOR1. An output of the inverter INV1 is connected to the other input terminal of the NOR circuit NOR1, to one input terminal of the NOR circuit NOR2 and to one input terminal of the NAND circuit NAND2.

An output of the NOR circuit NOR1 is connected to the other input terminal of the NOR circuit NOR2 and to the gate of the FET Q16 via a signal line NG23. An output of the NOR circuit NOR2 is entered to the inverter circuit INV6, while the output of the inverter circuit INV6 is supplied to the gate of the FETQ2 and to an input terminal of the inverter circuit INV2.

With the circuit configuration of the driving circuit of FIG. 5, constructed as described above, the operation of the reset side (decay or fall side) of the output signal OUT2 is the same as in the first embodiment described above. However, the circuit configuration is such that, on the rise side, there is provided a two-stage switching circuit by an FET Q16, and the signal level of the output signal OUT2 is fed back to the NOR circuit NOR1, whereby the rise operation for the output signal OUT2 occurs in two stages.

Figure 6:
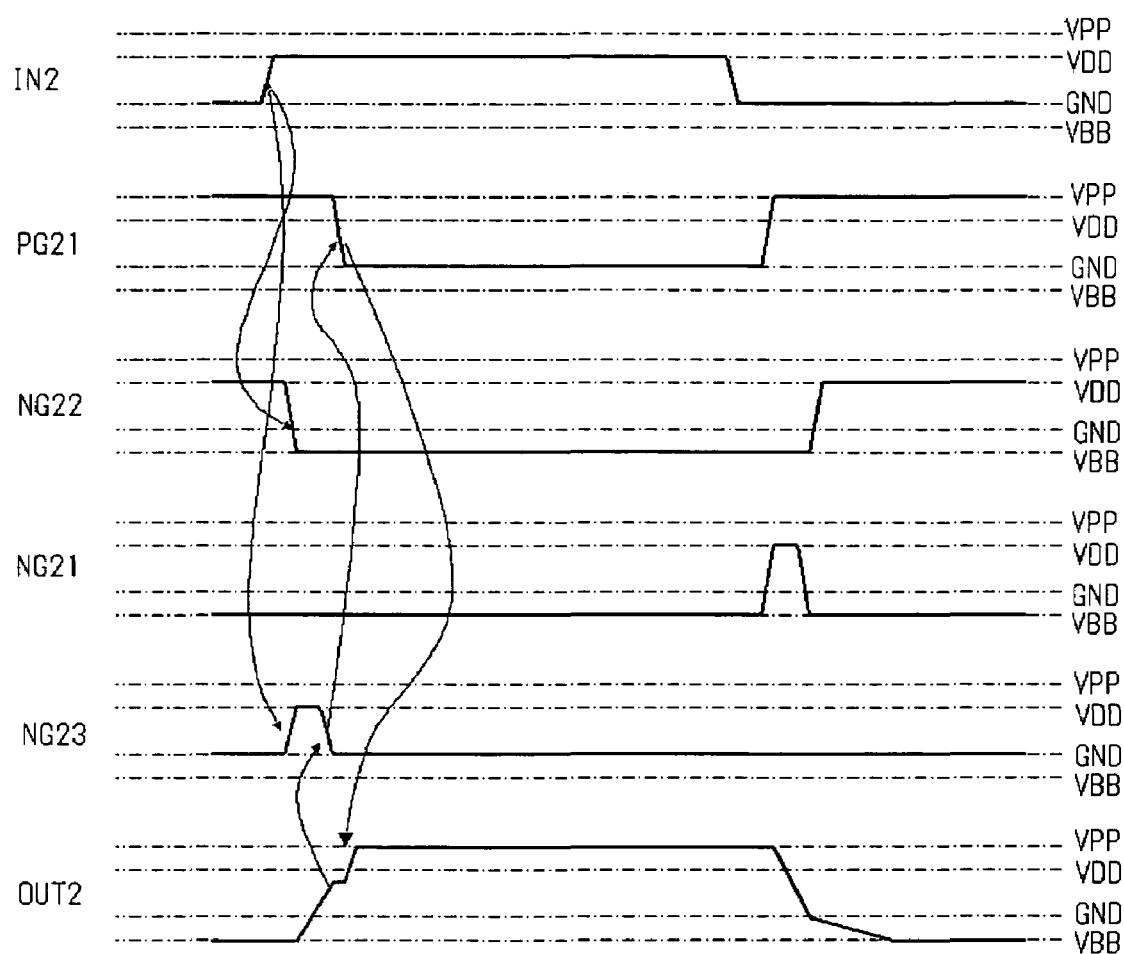
FIG. 6 is a timing chart for the word line driving circuit according to the second embodiment of the present invention.

The operation of the driving circuit shown in FIG. 5 is now explained. FIG. 6 depicts a timing chart of a word line driving circuit of the semiconductor driving circuit according to the second embodiment of the present invention.

In this driving circuit, responsive to the rising of the input signal IN2, a signal NG23, as an output of the NOR circuit NOR1 rises during the active operation of the DRAM, and hence the output signal OUT2 transiently rises in potential, via FET Q16, having its source connected to VDD, towards VDD−Vtn (Vtn being a voltage drop of the FET Q16). Responsive to the level of the output signal OUT2, the NOR circuit NOR1 is inverted, the signal N23 falls, while the signal PG21, as a drain signal of the FET Q1, also falls, with the output terminal OUT2 then rising to the VPP level via FET Q13 which has now been turned on.

The driving circuit, shown in FIG. 5, operates as described above, with the rising of the output signal OUT2, thus reliably switching the two-stage voltage pull-down operation. It is noted that the operation of falling of the output signal OUT2 is the same as that of the first embodiment described above.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage device comprising:
a word line driving circuit adapted for driving a word line by a driving potential changed in stages upon rise or fall, wherein
the word line driving circuit comprises a detection circuit for detecting the signal level of the word line to output the result of detection, with a timing of said word line driving potential being controlled based on an output of said detection circuit that said word line has been driven toward a second potential.

2. The semiconductor storage device as defined in claim 1 wherein said word line driving circuit drives said word line from a first potential towards the second potential;
said detection circuit detects that said word line has been driven towards said second potential; and wherein
said word line is driven towards a third potential based on an output of said detection circuit that said word line has been driven toward the second potential.

3. The semiconductor storage device as defined in claim 2 wherein said second potential is somewhere between said first and third potentials.

4. The semiconductor storage device as defined in claim 2 wherein said first potential is higher than a power supply voltage of said word line driving circuit, said second potential is the ground potential of said word line driving circuit, and wherein said third potential is lower than said ground potential.

5. The semiconductor storage device as defined in claim 2 wherein said first potential is lower than the ground potential of said word line driving circuit, said second potential is the potential of a power supply voltage of said word line driving circuit, and wherein said third potential is higher than said power supply voltage.

6. The semiconductor storage device as defined in claim 1 wherein said semiconductor storage device is a DRAM.

7. A semiconductor storage device comprising
a first driving circuit for driving a word line towards a first potential;
a second driving circuit for driving said word line towards a second potential;
a third driving circuit for driving said word line towards a third potential; and
a driving control circuit for actuating said first driving circuit when an input signal is at a first logical value, for actuating said second driving circuit when said input signal transfers from the first logical value to a second logical value and for actuating said third driving circuit on detection that said word line has been driven towards the second potential.

8. The semiconductor storage device as defined in claim 7 wherein said second potential is somewhere between said first and third potentials.

9. The semiconductor storage device as defined in claim 7 wherein said first potential is higher than a power supply voltage of said driving control circuit, said second potential is the ground potential of said driving control circuit, and wherein said third potential is lower than said ground potential.

10. The semiconductor storage device as defined in claim 7 wherein said first potential is lower than the ground potential of said driving control circuit, said second potential is the potential of a power supply voltage of said driving control circuit, and wherein said third potential is higher than said power supply voltage.

11. The semiconductor storage device as defined in claim 7 wherein said driving control circuit includes a logical circuit for detecting that said word line has been driven towards said second potential, and wherein said logical circuit is driven by a power supply voltage of said driving control circuit.

12. The semiconductor storage device as defined in claim 7 wherein said first and third driving circuits include a circuit for converting the signal level of said input signal.

13. The semiconductor storage device as defined in claim 7 wherein said semiconductor storage device is a DRAM.

14. A semiconductor storage device comprising:
a first driving circuit for driving a word line towards a first potential;
a second driving circuit for driving said word line towards a second potential;
a third driving circuit for driving said word line towards a third potential;
a fourth driving circuit for driving said word line towards a fourth potential; and
a driving control circuit for actuating the first driving circuit when an input signal is at a first logical value, for actuating the second driving circuit when said input signal transfers from said first logical value to a second logical value, for actuating the third driving circuit on detection that said word line has been driven towards said second potential, for actuating the fourth driving circuit when said input signal transfers from said second logical value towards said first logical value, and for actuating the first driving circuit on detection that said word line has been driven towards said fourth potential.

15. The semiconductor storage device as defined in claim 14 wherein said first potential is lower than the ground potential of said driving control circuit, said second potential is the potential of a power supply voltage of said driving control circuit, said third potential is higher than said power supply voltage and wherein said fourth potential is the ground potential of said driving control circuit.

16. The semiconductor storage device as defined in claim 14 wherein said driving control circuit includes a first logical circuit for detecting that said word line has been driven towards said second potential and a second logical circuit for detecting that said word line has been driven towards said fourth potential, said first and second logical circuits operating at a power supply voltage of said driving control circuit.

17. The semiconductor storage device as defined in claim 14 wherein said first and third driving circuits include a circuit for converting the signal level of said input signal.

18. The semiconductor storage device as defined in claim 14 wherein said semiconductor storage device is a DRAM.

* * * * *